(12) United States Patent
Magee

(10) Patent No.: US 9,021,291 B2
(45) Date of Patent: Apr. 28, 2015

(54) SYNCHRONOUS NETWORK

(75) Inventor: Anthony Magee, Leeds (GB)

(73) Assignee: ADVA Optical Networking SE, Meiningen OT Dreissigacker (DE)

( * ) Notice: Subject to any disclaimer, the term of this patent is extended or adjusted under 35 U.S.C. 154(b) by 615 days.

(21) Appl. No.: 13/325,746

(22) Filed: Dec. 14, 2011

(65) Prior Publication Data

US 2012/0324270 A1 Dec. 20, 2012

(30) Foreign Application Priority Data

May 6, 2011 (EP) .................................... 11165061

(51) Int. Cl.
| | |
|---|---|
| *G06F 1/12* | (2006.01) |
| *G06F 1/14* | (2006.01) |
| *H04L 7/00* | (2006.01) |
| *H04J 3/06* | (2006.01) |
| *H04J 3/14* | (2006.01) |
| *H03L 7/089* | (2006.01) |
| *H03L 7/099* | (2006.01) |
| *H04L 12/26* | (2006.01) |

(Continued)

(52) U.S. Cl.
CPC ........... *H04J 3/0688* (2013.01); *H04L 12/2697* (2013.01); *G06F 11/0751* (2013.01); *G06F 11/277* (2013.01); *G06F 1/10* (2013.01); *H04J 3/14* (2013.01); *H04L 12/2642* (2013.01); *H04J 3/0697* (2013.01); *H03L 7/0898* (2013.01); *H03L 7/099* (2013.01); *H03L 7/18* (2013.01); *H03L 2207/04* (2013.01); *H03L 2207/06* (2013.01)

(58) Field of Classification Search
CPC ......... G06F 1/04; G06F 1/10; G06F 11/0751; G06F 11/277

USPC ..................... 713/400, 500, 600; 370/395.62; 375/225

See application file for complete search history.

(56) References Cited

U.S. PATENT DOCUMENTS

| 5,917,870 | A | 6/1999 | Wolf |
|---|---|---|---|
| 6,965,224 | B1 | 11/2005 | Hey |

(Continued)

FOREIGN PATENT DOCUMENTS

| EP | 0 802 643 A2 | 10/1997 |
|---|---|---|
| EP | 1 492 226 A1 | 12/2004 |

OTHER PUBLICATIONS

Stefano Bregni: "Clock Stability Characterization and Measurement in Telecommunications", IEEE Transactions on Instrumentation and Measurement, IEEE Service Center, Piscataway, NJ, US, vol. 46, No. 6, Dec. 1, 1997, XP011024384, ISSN: 0018-9456, p. 1285, right hand column, paragraph IV.

(Continued)

*Primary Examiner* — Michael J Brown
(74) *Attorney, Agent, or Firm* — Erik G. Swenson; Norton Rose Fulbright US LLP

(57) ABSTRACT

A network node of a synchronous network, wherein said network node comprises a timing circuit which recovers a reference clock from a reception signal received by said network node from an upstream network node of said synchronous network and uses the recovered reference clock for a transmission signal transmitted by said network node to a downstream network node of said synchronous network; and a clock stability monitoring circuit which monitors internal control parameters (CP) of said timing circuit to detect an instability of the reference clock distributed within said synchronous network.

14 Claims, 12 Drawing Sheets

(51) Int. Cl.
  *G06F 11/07* (2006.01)
  *G06F 11/277* (2006.01)
  *G06F 1/10* (2006.01)
  *H03L 7/18* (2006.01)

(56) References Cited

U.S. PATENT DOCUMENTS 7,613,212 B1    11/2009  Raz et al.
8,213,436 B2 *   7/2012  Bedrosian ............... 370/395.62
2006/0125815 A1 * 6/2006  Ohtake ..................... 345/204
2010/0118894 A1   5/2010  Aweya et al.
2012/0027146 A1 * 2/2012  Hodge et al. ............ 375/356

OTHER PUBLICATIONS

Magee A: "Synchronization in next-generation mobile backhaul networks", IEEE Communications Magazine, IEEE Service Center, Piscataway, US, vol. 48, No. 10, Oct. 1, 2010, pp. 110-116, XP011319414, ISSN: 0163-6804, p. 111, right hand column, paragraph 2 thru p. 112, right hand column, paragraph 1; figures 2, 5.

* cited by examiner

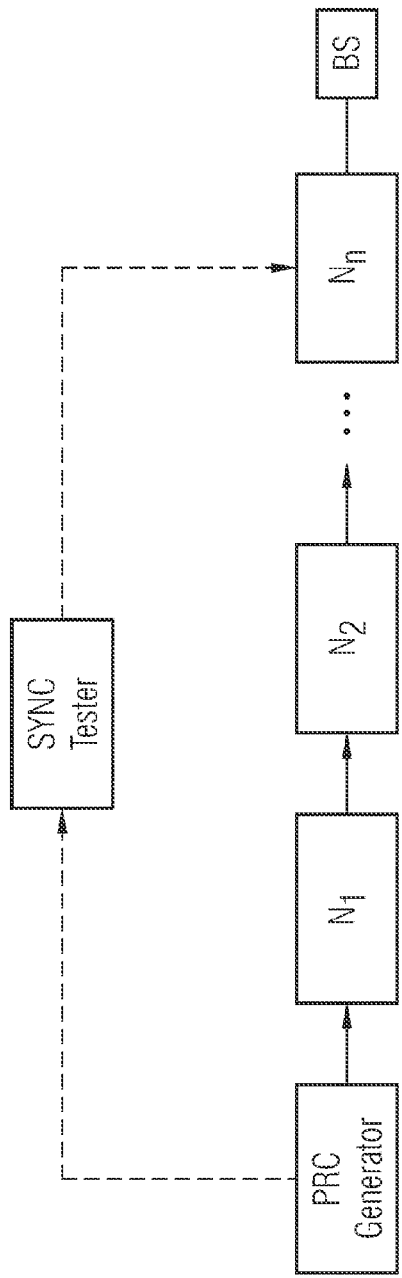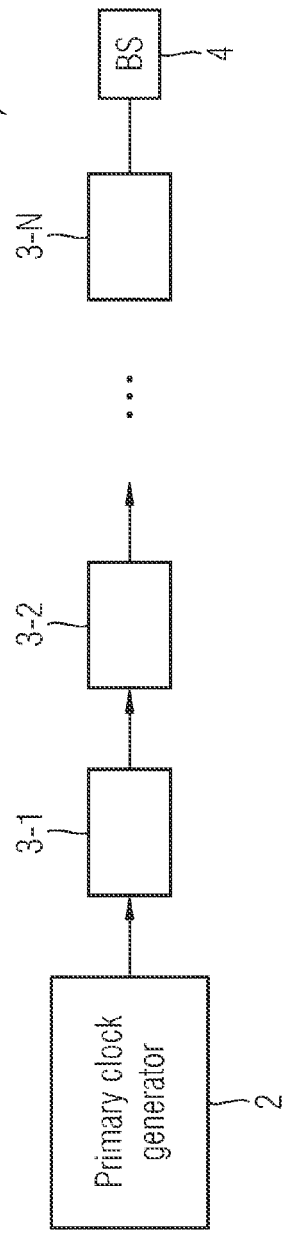

| Time | CP$_1$ | CP$_2$ |
|---|---|---|
| $t_1$ | $CP_{11}$ | $CP_{21}$ |
| $t_2$ | $CP_{12}$ | $CP_{22}$ |
| $t_3$ | $CP_{13}$ | $CP_{23}$ |
| $t_4$ | $CP_{14}$ | $CP_{24}$ |
| ⋮ | ⋮ | ⋮ |

CPT

SYNCHRONOUS NETWORK

BACKGROUND OF THE INVENTION

The invention relates to a synchronous network and in particular to a synchronous network comprising network nodes having a clock stability monitoring circuit to detect an instability of a reference clock distributed within the synchronous network.

FIG. 1 shows a conventional synchronous network comprising a chain of network nodes N to receive a reference clock being generated by a primary reference clock (PRC) generator. The primary reference clock generator can be for example located in a central office of a mobile service operator. The last network node $N_n$ of the chain of nodes shown in FIG. 1 can be connected to a base station of a mobile telephone network. The nodes N as shown in FIG. 1 can be for example formed by synchronous Ethernet devices comprising ports to exchange data with each other. The conventional practice for monitoring time and frequency accuracy in a synchronous network such as shown in FIG. 1 is to deploy a synchronization test equipment, i.e. a synchronization tester as shown in FIG. 1 which can be connected to the network node N to be investigated e.g. to the last network node $N_n$ of the chain as shown in FIG. 1. Further, the synchronization test equipment has access to the primary reference clock PRC generated by the PRC generator, for example via a GPS connection. The synchronization test equipment uses the reference time source to measure the accuracy of the synchronization in an end-to-end manner. The network node $N_n$ of the node chain within the synchronous network can be for example a cell site gateway to which a base station of a mobile telephone network is connected. The base station is provided with a reference frequency by the cell site gateway and can be used by the base station for example for maintaining an accurate carrier frequency. The base stations have to be aligned to each other, for example by means of a UTC (Universal Time Coordinated) provided by a GPS receiver. However, the provision of a GPS receiver is expensive and the network becomes unscalable. Further, there are security concerns since a GPS signal can be jammed. Accordingly, it is desirable to have a synchronous network which provides a distributed reference clock for all network nodes of a synchronous network and also for all nodes connected to such a synchronous network, for example for a base station as shown in FIG. 1, wherein the reference clock is generated by a central reference clock generator such as the primary reference clock generator shown in FIG. 1. The reference clock or reference frequency is transported through the chain of network nodes from the source, i.e. the PRC generator throughout all network nodes until the last network node is reached.

Because of faulty circuits or devices within the network node chain the transported frequency information can be disturbed so that the upstream network nodes don't get the right reference information. In a conventional system the transportable synchronization test equipment is used to compare the primary reference clock generated by the central source with the clock signal of the investigated network node as shown in FIG. 1. This conventional way of detecting an instability of a reference clock distributed within a synchronous network has several disadvantages. The first disadvantage is that the synchronization test equipment has to be connected physically to the network node to be investigated so that the synchronization tester has to be transported and connected to the respective network node. A further disadvantage is that the synchronization test equipment needs to have access to the primary reference clock, for example via a GPS receiver. However, such a GPS signal is not available at many locations where the synchronization test equipment can therefore not be used. A further disadvantage of the conventional way of detecting reference clock instability is that it only provides an end-to-end coverage between the investigated network node and the primary reference clock source. It is not visible what happens between the investigated network node and the primary reference clock source. For example, if the reference clock of the investigated network node to which the synchronization tester is connected deviates from the primary reference clock PRC it cannot be detected where in the intermediate chain of network nodes the deviation has been caused. Accordingly, the synchronization test equipment connected to an investigated network node such as network node $N_n$ as shown in FIG. 1 cannot identify the location of a faulty network node causing a deviation of the reference clock at the investigated network node. For example, if the deviating reference clock is caused by a faulty circuit within network node N1 synchronization test equipment connected to the last network node Nn is not able to identify the location of the error. Consequently, the conventional synchronization test equipment as shown in FIG. 1 the synchronization test equipment has to be moved upward towards the upstream network nodes until the erroneous network node is found. Naturally, this is very cumbersome and time consuming. A further disadvantage is that the synchronization test equipment is very complex and expensive and needs a physical interface to be connected to an investigated network node of the synchronous network.

Accordingly, there is a need for a synchronous network where instability of a reference clock distributed within said synchronous network can be efficiently detected.

BRIEF SUMMARY OF THE INVENTION

The invention provides a network node of a synchronous network,
wherein said network node comprises:
  a timing circuit which recovers a reference clock from a reception signal received by said network node from an upstream network node of said synchronous network and uses the recovered reference clock for a transmission signal transmitted by said network node to a downstream network node of said synchronous network; and
  a clock stability monitoring circuit which monitors internal control parameters of said timing circuit to detect an instability of the reference clock distributed within said synchronous network.

In a possible embodiment of the network node according to the present invention the timing circuit comprises a phase locked loop circuit for recovery of the reference clock from the reception signal.

In a possible embodiment of the network node according to the present invention the phase locked loop circuit of said timing circuit is an analogue phase locked loop circuit.

In a further possible embodiment of the network node according to the present invention the phase locked loop circuit of the timing circuit is a digital phase locked loop circuit.

In a possible embodiment of the network node according to the present invention the clock stability monitoring circuit monitors the internal control parameters of said timing circuit in the time domain.

In a further possible embodiment of the network node according to the present invention the clock stability monitoring circuit monitors the internal control parameters of said timing circuit in the time or frequency domain.

In a possible embodiment of the network node according to the present invention the monitored control parameters are written into a control parameter table stored in a local memory of the respective network node.

In a further possible embodiment of the network node according to the present invention the clock stability monitoring circuit generates an alarm message if a monitored control parameter is not within a predetermined normal operation range.

In a possible embodiment of the network node according to the present invention the distributed reference clock is generated by a primary reference clock generator of the synchronous network.

In a possible embodiment of the network node according to the present invention the control parameter table stored in the local memory of the network node is read out by a network management system of the synchronous network.

In a possible embodiment of the network node according to the present invention the network management system analyses the read out control parameters of the network node to identify a faulty entity within the network node causing a reference clock instability in the synchronous network.

In a possible embodiment of the network node according to the present invention the network node further comprises an injection circuit to adapt at least one control parameter of the timing circuit of said network node to cause an observable change of the reference clock forwarded to a downstream network node.

In a possible embodiment of the network node according to the present invention the network node is a synchronous Ethernet device.

In a possible embodiment of the network node according to the present invention the network node is a Precision Time Protocol (PTP) device.

In a possible embodiment of the network node according to the present invention the clock stability monitoring circuit is embedded in the respective network node.

In a possible embodiment of the network node according to the present invention the timing circuit comprises a register in which dummy data is written with a reception clock rate and from which said dummy data is read with a transmission clock rate to detect a clock instability by monitoring a flag signal of said register.

In a possible embodiment the register is a FIFO register.

The invention provides a synchronous network comprising network nodes,
wherein each network node comprises
 a timing circuit which recovers a reference clock from a reception signal received by said network node from an upstream network node of said synchronous network and uses the recovered reference clock for a transmission signal transmitted by said network node to a downstream network node of said synchronous network and
 a clock stability monitoring circuit which monitors internal control parameters of said timing circuit to detect an instability of the reference clock distributed within said synchronous network,
wherein said synchronous network further comprises:
 a primary reference clock generator for generating a primary reference clock distributed in said synchronous network, and
 a network management system for analyzing the control parameters of the network nodes of said synchronous network in the time or frequency domain.

In a possible embodiment of the synchronous network according to the present invention at least one network node is connected to a base station of a mobile telephone network which receives the distributed reference clock from the synchronous network.

The invention further provides a method for detecting an instability of a reference clock distributed within a synchronous network,
wherein internal control parameters of a timing circuit adapted to recover the distributed reference clock within a network node of said synchronous network are monitored to detect the instability of the distributed reference clock.

BRIEF DESCRIPTION OF THE DRAWINGS

In the following possible embodiments of the synchronous network comprising network nodes and the method for detecting an instability of a reference clock distributed within such a synchronous network are described with reference to the enclosed figures.

FIG. 1 shows a diagram for illustrating a conventional way of detecting an instability distributed reference clock;

FIGS. 2A, 2B show diagrams for illustrating possible embodiments for a synchronous network according to the present invention;

DETAILED DESCRIPTION OF THE INVENTION

As can be seen in FIG. 2A the synchronous network 1 according to the present invention comprises in the shown embodiment a primary reference clock (PRC) generator 2 to which a chain of network nodes 3-1, 3-2 ... 3-N is connected. The primary reference clock generator 2 can be located for example in a central office of a mobile telephone service operator. The network nodes 3-i can be connected to each other via wired or wireless links, wherein each network node 3-i comprises one or several ingress ports as well as one or several egress ports for connecting the respective network node 3-i with other network nodes of the synchronous network 1. In the shown example of FIG. 2A a base station 4 of a telephone network is connected to the last network node 3-N of the synchronous network 1. The network nodes 3-i can for example be formed by synchronous Ethernet devices. The Ethernet devices can comprise switches, routers or bridges. The network nodes 3-i can form devices for any kind of packet switched network. The last network node 3-N of the chain of network nodes 3-i as shown in FIG. 2 can for example form a gateway or demarcation point of a service provider. The base station 4 can for example be a eNodeB of a LTE system. Data traffic is forwarded downstream from the first network node 3-1 to the last network node 3-N. The network nodes 3-*i* shown in FIG. 2A can also be 1588 PTP nodes (PTP: Precision Time Protocol). In this embodiment a Time of Day register can be sampled and the results can be tabulated. A frequency to be monitored can be recovered via the 1588 PTP protocol. The devices or nodes within the network may support 1588 PTP implementations such as a Boundary Clock BC, a Transparent Clock TC or an ordinary clock. The devices can also use synchronous Ethernet to provide a frequency lock at the physical layer.

Figure 2B:
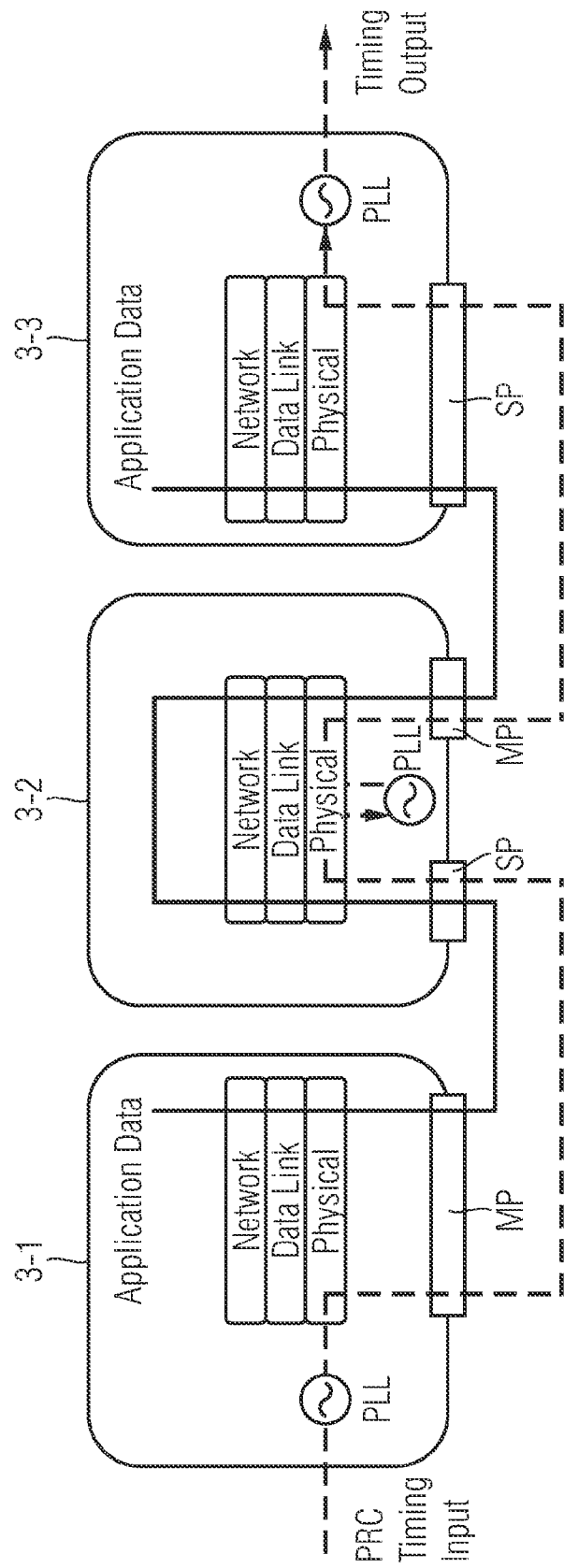

FIG. 2B shows a chain of a network node 3-1, 3-2, 3-3 in more detail. In the shown embodiment each network node 3-1, 3-2, 3-3 comprises a phase locked loop circuit PLL, wherein the phase locked loop circuit PLL of the first network node receives a primary reference clock from the primary clock generator 2 as shown in FIG. 2A. The recovered clock signal is forwarded along with application data of the first network node 3-1 via a master port MP A0 or a slave port SP of the next network node 3-2 within the chain. In the shown embodiment the application data is forwarded by the second network node 3-2 via its master port MP A0 to the slave port SP of the last network node 3-3 within the chain as can be seen in FIG. 2B. Further, the clock signal of the PLL circuit within the second network node 3-2 is also forwarded to the PLL circuit of the last network node 3-3. Accordingly, in the embodiment of FIG. 2B all network nodes 3-*i* comprise an integrated PLL circuit.

Figure 3:
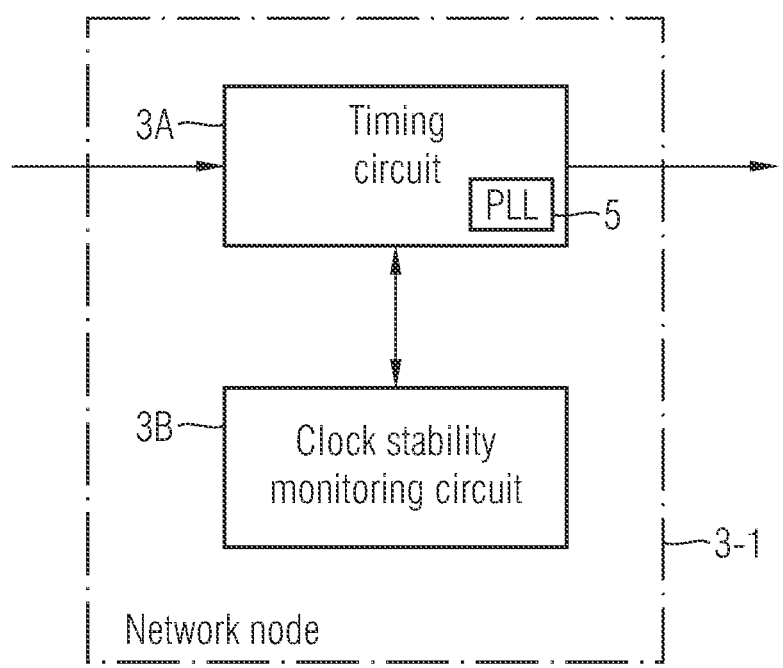
FIG. 3 shows a block diagram of a possible embodiment of a network node according to the present invention.

FIG. 3 shows a block diagram of a possible embodiment of a network node 3-*i* of the synchronous network 1 as shown in FIG. 2. The network node 3 comprises a timing circuit 3A and a clock stability monitoring circuit 3B. The timing circuit 3A recovers a reference clock from a reception signal received by said network node 3 from an upstream network node of said synchronous network 1, wherein the recovered reference clock is used for a transmission signal transmitted by said network node 3 to a downstream network node of the synchronous network 1. The timing circuit 3A can comprise a timing recovery unit which recovers the received reference clock. A clock and data recovery circuit CDR can recover the clock and data and pass the recovered clock signal to a phase locked loop PLL circuit 5 within the timing circuit 3A. The phase locked loop circuit PLL can be an analogue phase locked loop (APLL) or a digital phase locked loop circuit (DPLL). The timing circuit 3A comprising the PLL circuit 5 uses internal control parameters CP or control signals to perform the reference clock recovery. For example, the PLL circuit 5 within the timing circuit 3A can comprise as a control parameter CP a control voltage for controlling a voltage controlled oscillator VCO within the timing circuit 3A. In case of a DPLL a control parameter CP can be a frequency control word.

The network node 3 according to the present invention as shown in the embodiment of FIG. 3 further comprises a clock stability monitoring circuit 3B which can monitor the internal control parameters CP of the timing circuit 3A to detect an instability of the reference clock distributed within the synchronous network 1. For example, the clock stability monitoring circuit 3B can be adapted to monitor a control parameter CP or a control signal such as the control voltage of a voltage controlled oscillator VCO to detect an instability of the reference clock. For example, the clock stability monitoring circuit 3B can detect an instability if the monitored control parameter CP is not within a predetermined normal operation range. In a possible embodiment a baseline test of the network is performed when there are no problems for capturing the baseline characteristics of the control parameters CP and to define normal operation ranges of the control parameter CPs.

For example, an unstable reference clock can be detected if the control voltage of the voltage controlled oscillator VCO of the PLL circuit 5 within the timing circuit 3A is out of a predetermined normal operation voltage range. The clock stability monitoring circuit 3B can monitor the internal control parameters CP of the timing circuit 3A in the time domain but also in the frequency domain. In a possible embodiment the clock stability monitoring circuit 3B generates an alarm message if a monitored control parameter CP of a circuit within the timing circuit 3A or of a control program executed by a microprocessor within the timing circuit 3A is not within a predetermined normal operation range to indicate an instable reference clock. Control parameters from the memory table of network nodes can be read in a round-robin manner to collect results which a network reads at intervals to provide confidence that the network is operational.

Figure 4A:
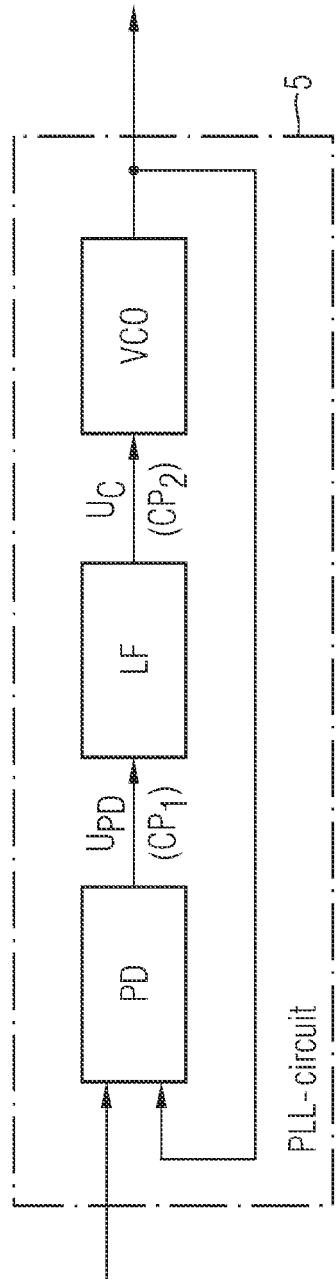
FIGS. 4A-4E show block diagrams of phase locked loop circuits as used within a timing circuit of a network node according to different embodiments of the present invention.

FIG. 4A shows a block diagram of a PLL circuit 5 which can be used within a timing circuit 3A of a network node 3 as shown in FIG. 3. A clock and data recovery circuit of the timing circuit 3A can pass the recovered clock to the phase locked loop circuit 5 for improving the recovered clock signal. The phase locked loop circuit 5 as shown in FIG. 4A is a simple analogue phase locked loop circuit APLL. In an alternative embodiment the phase locked loop circuit 5 used by the timing circuit 3A can be a digital phase locked loop circuit DPLL. The PLL circuit 5 as shown in FIG. 4A has a phase detector PD with two inputs comprising a reference input and a feedback input to receive a feedback signal from the voltage controlled oscillator VCO. The phase detector PD regulates the control signal to the voltage controlled oscillator VCO such as the phase difference between the two input signals is held constant. The phase locked loop PLL maintains the output signal in a specific phase relationship with the reference signal. The phase detector PD produces an output voltage proportional $\mu_{PD}$ to the phase difference $\Delta 4A$ of the two input signals. The voltage controlled oscillator VCO produces an output signal whose frequency f is proportional to the input control voltage $U_c$ as shown in FIG. 4A. The loop filter LF is used to control the PLL dynamics. The output signal of the phase detector PD and the control voltage output by the loop filter LF form in the given simple example controlled parameters CP of the timing circuit 3A which can be monitored by the clock stability monitoring circuit 3B of the network node 3. The clock stability monitoring circuit 3B can monitor one or several control parameters CP of the timing circuit 3A.

Figure 4B:
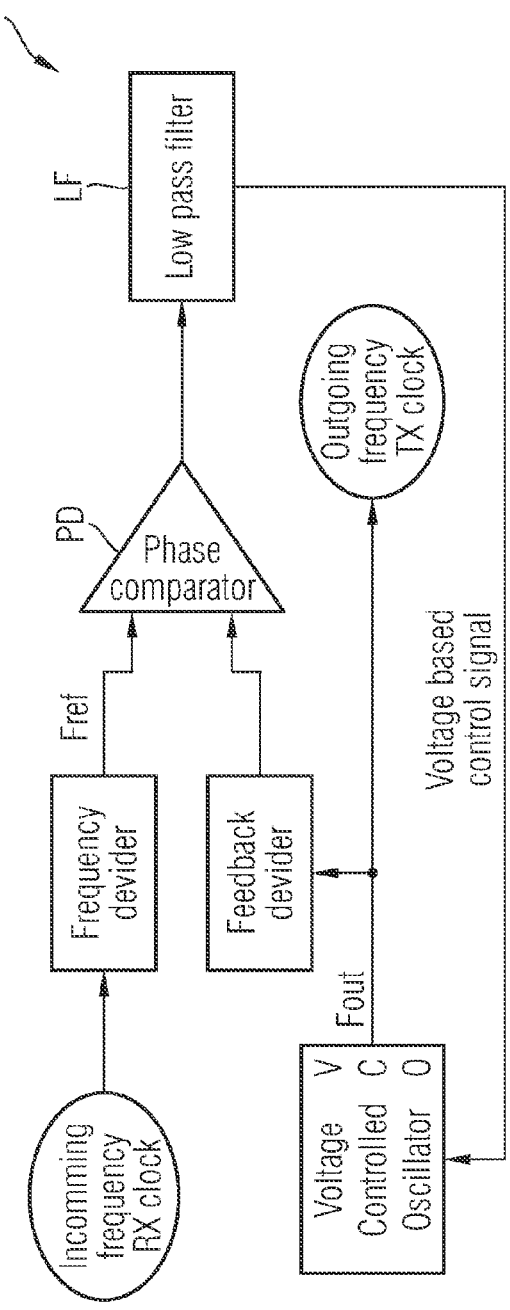

FIG. 4B shows a further exemplary embodiment of a PLL circuit 5 which may be used in a timing circuit 3A of a network node 3-*i* according to the present invention. The PLL circuit 5 as shown in FIG. 4B is an analogue PLL circuit comprising a low pass filter as a loop filter LF and a voltage controlled oscillator VCO. In the shown embodiment the low pass filter applies a voltage based control signal to the voltage controlled oscillator VCO which generates the outgoing frequency TX clock signal. The PLL circuit further comprises a frequency divider for dividing the frequency of the incoming frequency RX clock and a feedback divider dividing the output signal of the voltage controlled oscillator VCO. The output signals of the frequency divider as well as of the feedback divider are applied to the phase comparator PD of the PLL circuit 5 as shown in FIG. 4B.

Figure 4C:
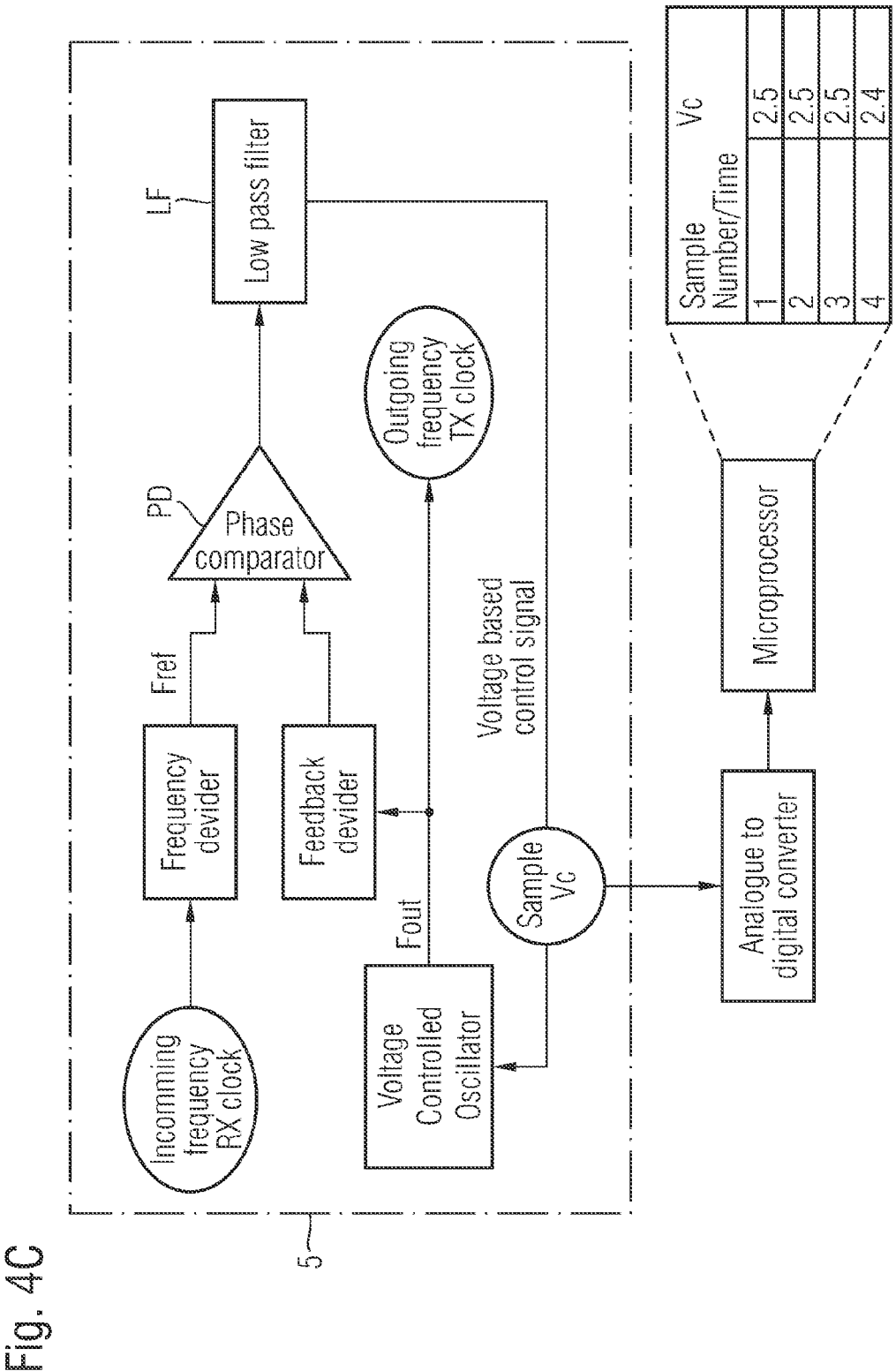

FIG. 4C illustrates how an internal control parameter of the PLL circuit 5 as shown in FIG. 4B is monitored by a clock stability monitoring circuit 3B within the network node 3-*i* according to the present invention. In the shown embodiment the output signal of the low pass filter LF provides a voltage based control signal for the voltage controlled oscillator VCO within the PLL circuit 5 which is sampled and applied to an analogue to digital converter which supplies the sampled control voltage of the VCO as an internal control parameter CP, for example to a microprocessor as shown in FIG. 4C. The samples can be written by the microprocessor into a local memory storing different samples of the control parameter CP over time as shown in FIG. 4C.

Figure 4D:
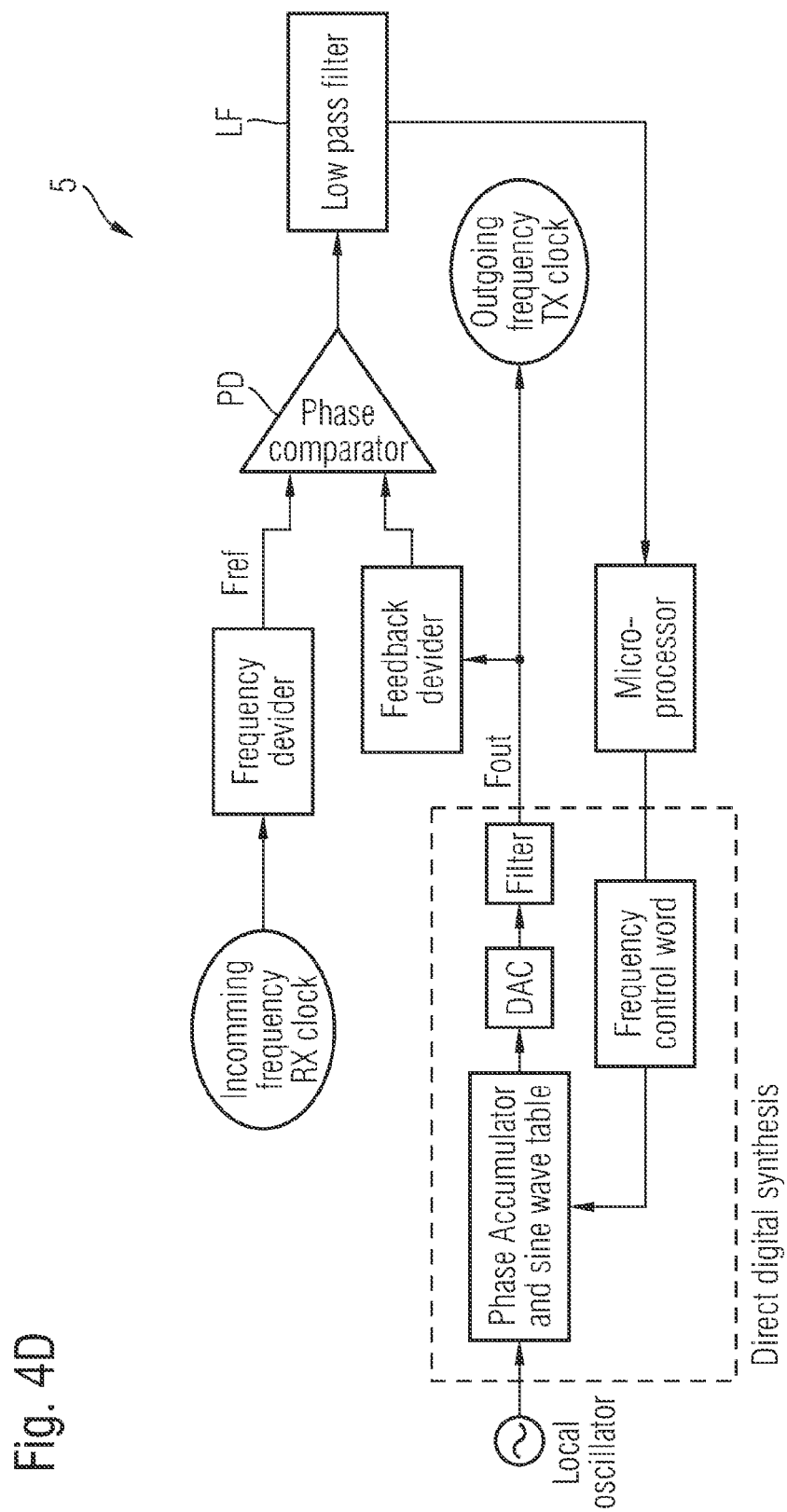

FIG. 4D shows a further exemplary embodiment of a PLL circuit 5 as used within a timing circuit 3A of a network node 3-i according to the present invention. In this exemplary embodiment the phase locked loop circuit 5 is formed by a digital DDDS based phase looked loop. The output signal of the low pass filter LF is applied by a microprocessor to a circuit for direct digital synthesis (DDS) wherein a frequency control word is applied to a phase accumulator and a sine wave table connected to a local oscillator. The output signal of the phase accumulator is applied to a digital analogue converter DAC and filtered by an analogue filter before being output and applied to the feedback divider of the phase locked loop circuit 5.

Figure 4E:
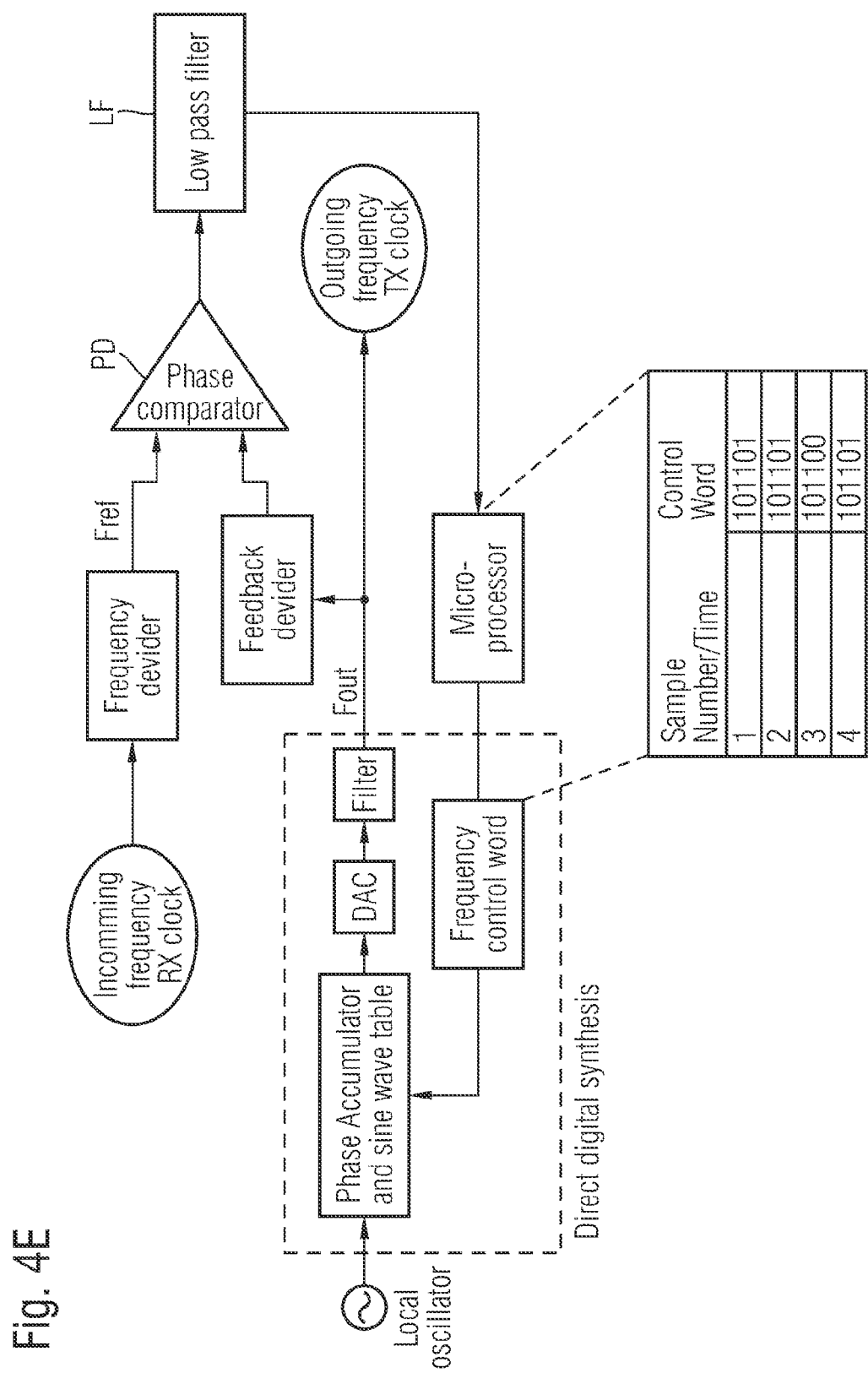

FIG. 4E shows that the control words of the microprocessor can be used as control parameters CP monitored by a clock stability monitoring circuit 3B within the network node according to the present invention.

Figure 5:
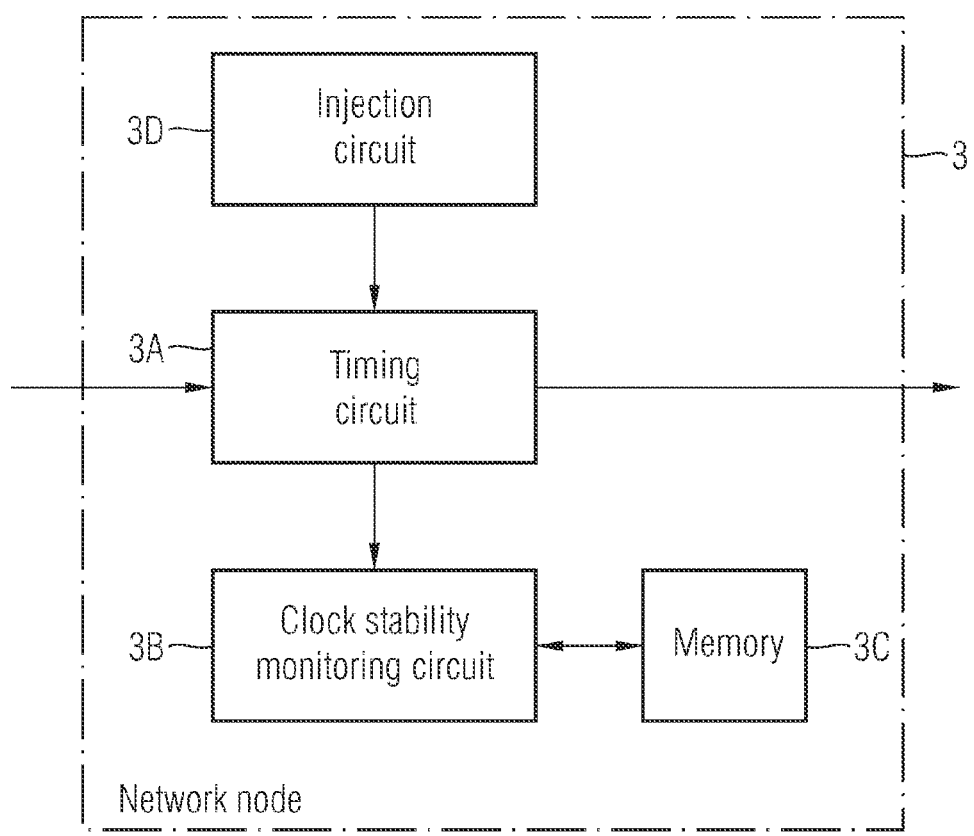
FIG. 5 shows a block diagram of a further possible embodiment of a network node according to the present invention.

FIG. 5 shows a further possible embodiment of a network node 3 within a synchronous network 1 according to the present invention. In the shown embodiment all network nodes 3 further comprise a local memory 3C. In the shown embodiment the clock stability monitoring circuit 3B stores monitored control parameters CP in the local memory 3C of the network node 3. The control parameters CP such as the control voltage $U_c$ of the voltage controlled oscillator VCO of the PLL circuit 5 within the timing circuit 3A can be written for example into the local memory 3C of the respective network node 3. In a further possible embodiment the network node 3 further comprises an interface which allows a network management system NMS to access the data stored in the local memory 3C. Control parameters from the memory table of network nodes can be polled and read in a round robin manner to collect results which network management system NMS of the network can read at intervals.

In a further alternative embodiment the control parameter table CPT stored in the memory 3C is forwarded by the network node 3 as payload within data packets to the data interface. In the embodiment shown in FIG. 5 the network node 3 further comprises an injection circuit 3D. The injection circuit 3D is adapted to change at least one control parameter CP of the timing circuit 3A in the network node 3 to cause an observable change of the reference clock forwarded to a downstream network node 3 where the change can be monitored by the clock stability monitoring circuit 3B of this downstream network node. Further, the injection circuit 3B can be provided for injecting a phase offset of the distributed reference clock and increase or decrease a frequency by a fixed value and to cause a clock or frequency change that is observable by a downstream network node 3 within the network node chain. The phase change is distinguishable from a random noise caused within the phase locked loops PLL of the downstream network nodes. The intentional disturbance provided by the injection circuit 3D can be observed by a clock stability monitoring circuit 3B of a downstream network node 3 within the chain of nodes.

The clock stability monitoring circuit 3B as well as the injection circuit 3D can be integrated in an embedded system within the network node 3 and can even be integrated in the timing circuit 3A of the respective network node.

Figures 6, 7:
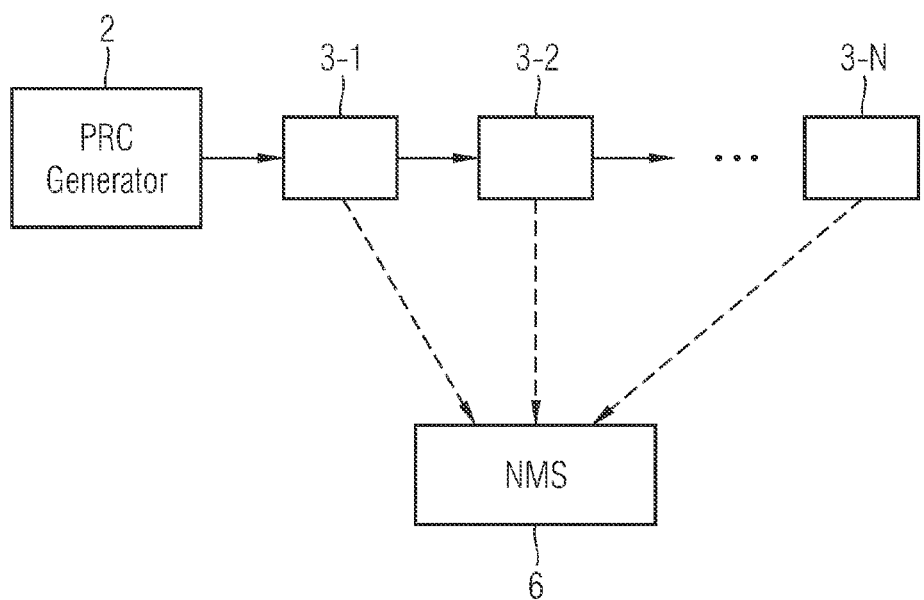
FIG. 6 shows a table for illustrating a control parameter table as used within a synchronous network according to a possible embodiment of the present invention.
FIG. 7 shows a diagram for illustrating a possible embodiment of a synchronous network according to the present invention comprising a network management system.

FIG. 6 shows an example of a control parameter table CPT which can be stored by a clock stability monitoring circuit 3B within a local memory 3C of the network node 3. As shown in FIG. 6 a time where a control parameter CP or several control parameters CP, measured, is stored along with the measured values of the respective control parameters CP, control signals within the timing circuit 3A. The control parameter table CPT stored in the local memory 3C can comprise a single control parameter but also several control parameters of the timing circuit 3A. In a further embodiment the control parameter table CPT as shown in FIG. 6 can be read out by a network management system NMS 6 of the synchronous network 1 as shown in FIG. 7. This network management system 6 can analyse the read out control parameters CP of the network node 3 to identify a faulty entity within the network node 3 causing a reference clock instability in the synchronous network 1. The evaluation and analyzing of the control parameters CP stored in the control parameter table CPT can be also performed internally by the clock stability monitoring circuit 3B. The clock stability monitoring circuit 3B can monitor the internal control parameters CP in the time domain as well as in the frequency domain. In a possible embodiment the clock stability monitoring circuit 3B can generate an alarm message if a monitored control parameter CP is not within a predetermined normal operation range.

FIG. 7 shows a block diagram of a possible embodiment of a synchronous network 1 according to the present invention comprising a network management system 6 which can read out control parameters CP from the network nodes 3-i. The communication channel shown in FIG. 7 is a logical communication channel. The read out control parameters CP of the different control parameter tables CPTs of the different network nodes 3 can be analyzed by the network management system 6 in the time or frequency domain. The network management system 6 can monitor a variance in the frequency domain of the control signals or control parameters CP of each network element or network node 3-i. The network management system 6 has access to the distributed generated data. In a possible embodiment the network management system 6 can also comprise a graphical user interface GUI for a user. For example, a graphical representation can present a variance of synchronization updates across a chain of network elements 3. In a possible embodiment the network management system 6 can perform a frequency analysis of synchronization updates across a chain of network nodes 3 and overlaying these in a chart to identify an individual network node variance without the need for a reference traceable time source. The present invention provides a method for detecting an instability of a reference clock distributed within the synchronous network 1. The internal control parameters CP of the timing circuits 3A of the different network nodes 3-i are monitored to detect an instability of the distributed reference clock. This can also be performed by a computer program or monitoring tool executed by a processing unit. This monitoring tool can for example be executed by the network management system 6 as shown in FIG. 7. This monitoring tool forms a reference clock synchronization monitoring tool which allows during operation a monitoring of each network node 3 of the synchronous network 1. The method according to the present invention allows a widespread monitoring with increased coverage of individual network nodes 3 without the use of a specific test equipment. The method of the present invention offers a synchronization monitoring capability in cases where an access to a reference traceable timing source is difficult to provide, for example an access to a GPS source in a location where GPS coverage is weak or impractical.

The method according to the present invention can rely on a low level hardware monitoring of the control signals or control parameters CP within clock stability monitoring circuits 3B of different network nodes 3. For example, also control word updates in a digital PLL or a time of day register can be monitored. By analyzing these variables or control parameters CP in the time domain and by comparing samples one can observe an intended delta change in frequency or time. Furthermore, by performing for example a fast Fourier transformation FFT of the time varying signal a spectrum plot can be generated showing dominant frequency trends that effect network nodes 3 or synchronization components of the synchronous network 1. For example, by viewing FFT plots for each network node 3 in a combined chart useful information can be derived about the synchronous network 1 according to the present invention.

If all network nodes 3 are synchronized to each other all network nodes synchronized to a first network node show a sympathetic or aligned synchronization trend and thus comprise similar spectrum components. If a network node 3 and its downstream network nodes deviate from upstream network nodes it can be deduced that an instability is occurring between two individual network nodes. Furthermore, long term stability trends can be observed and a warning can be generated to allow a pre-emptive maintenance of the synchronous network 1. With the method according to the present invention one can use a frequency analysis of the synchronization updates across the chain of network nodes 3 by overlaying these in a chart. In this way the monitoring software tool can provide useful information to an operator.

Figure 8:
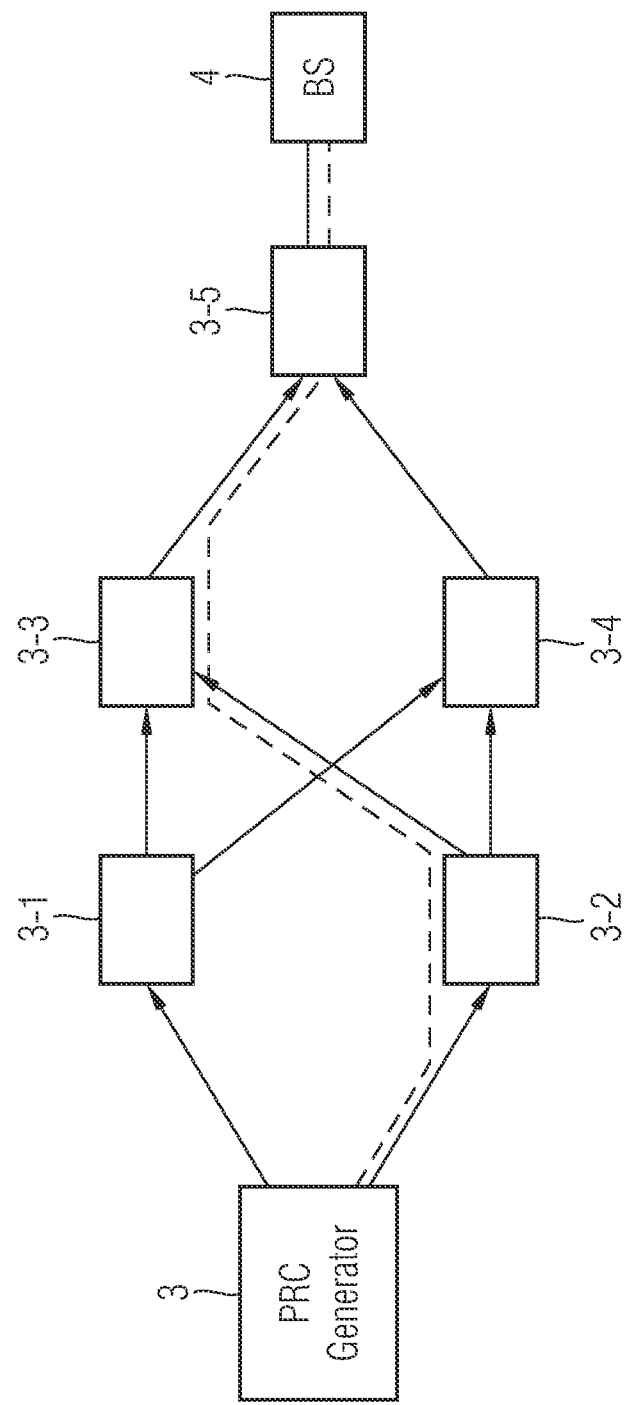
FIG. 8 shows a further possible embodiment of a synchronous network according to the present invention.

FIG. 8 shows a further possible embodiment of a synchronous network 1 according to the present invention. In this exemplary embodiment the network 1 is a meshed network comprising several network nodes 3-$i$. In such a meshed network a signal path can be reserved for reference clock distribution as indicated by the dashed line in FIG. 8. If an instability of the distributed reference clock can be observed by the method according to the present invention it is also possible in a specific embodiment that a switch-over to another clock distribution path is performed. In a possible embodiment the injection circuit 3D of an upstream network node is used to apply a phase offset to the output frequency: $F_{out}=F_{ref}+F_{offset}$, where $F_{offset}>\Delta FN'$, wherein $\Delta FN'$ is the random noise contribution of a local oscillator of the network node.

If one network node 3 loses lock the oscillator will start to free run and will slowly start to move to one end of its control, i.e. push through to a maximum or pull to a minimum where the $\Delta FN'$ is likely to be large and can pose a significant phase difference. In a synchronous Ethernet node 3 there can be a holdover oscillator that is used when an incoming frequency exceeds a certain threshold. It can be useful to continue to monitor an incoming signal that is no longer used for passing to a transmit port as information about the failure mode. Thus, the network nodes 3 are able to track that clock and therefore cause a shift in variance and mean value that is observable above a random noise contribution. In a normal operation one only sees a random noise. If the network node lose lock during normal operation its phase locked loop circuit PLL will move over a period of time to one end of the PLL frequency range or otherwise very widely between a maximum and minimum value. The monitoring tool performing the method according to the present invention is able to observe in a possible embodiment the trends in a PLL mean value and variance thus to identify a network node 3 which is displaying this behaviour. This can be highlighted to an operator showing a specific network node 3 as being instable. The network nodes 3 downstream from a faulty network node are likely to track the frequency generated by the phase locked loop PLL of the faulty network node. Accordingly, it is possible to identify where in the network chain the fault has occurred. Therefore, it is possible to isolate a fault within two network nodes. A network node upstream of a first network node showing instability may generate a clock out of lock from the reference input, or the first network node showing instability may not be able to track a good reference clock.

The network management system 6 as shown in FIG. 7 can be used to gather results from network nodes 3. Downstream network nodes are capable of tracking a phase offset. The variance recorded at downstream network nodes can show a trend in the mean value of the PLL signal attempting to speed the local oscillator up or slow it down depending on the polarity of the offset. This enables diagnostics to take place within the synchronous network 1 without requiring a primary reference clock PRC based test equipment or a truck roll. The method for detecting an instability of the reference clock can be used during deployment of the synchronous network 1 or during a maintenance time window. The method allows to transport a reference frequency or reference clock over a synchronous network 1 where any instability is monitored and detected fast and efficiently without too much technical complexity. With the method and system according to the present invention it is possible to monitor a clock stability and to detect synchronization trends in a distributed synchronous network 1 without the need for a reference traceable time source.

Figure 9:
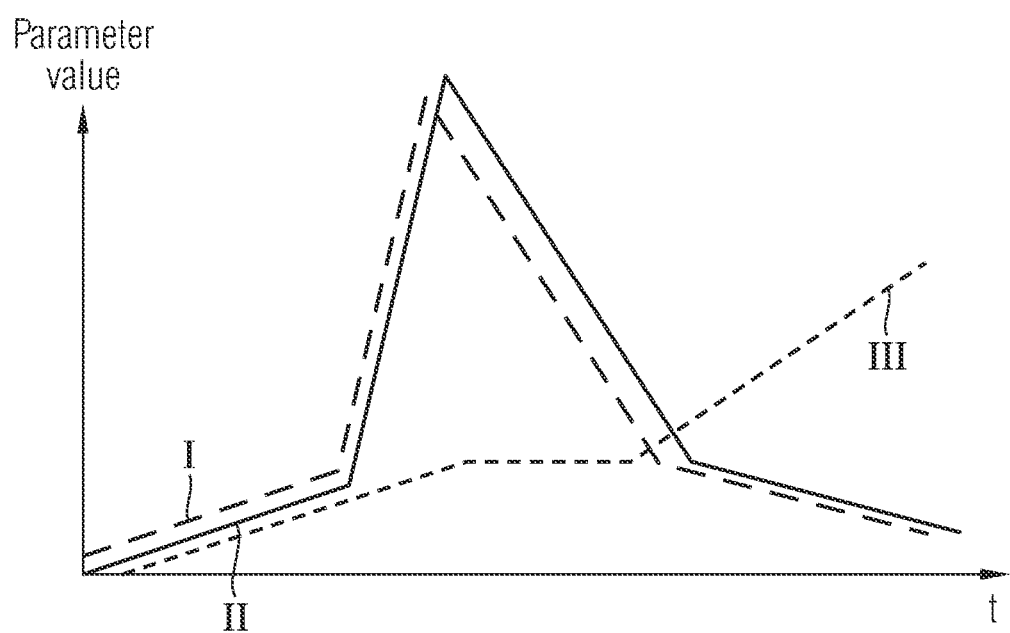
FIG. 9 shows an exemplary for illustrating the functionality of a synchronous network according to the present invention.

FIG. 9 shows an example of a chart which can be displayed to an operator or user, for example via a graphical user interface GUI of the network management system 6 as shown in FIG. 7. A parameter value of a control parameter CP can be shown over time to the user. In the shown exemplary chart different curves show a parameter value over time for different network nodes. Curves I and II show a control parameter value of a control parameter CP such as a control voltage of a voltage control oscillator VCO within a timing circuit 3A of two network nodes 3 which are locked to each other. Curve III shows the parameter value of a third network node which does not track the other two nodes. By overlaying the node time domain signals of the specific control parameter CP of the timing circuits 3A of the different network nodes 3 it is possible to detect that the third network node comprises an instability in the distributed reference clock. From the chart shown in FIG. 9 it can be derived that the third network node cannot track the input transmitted to it via the second network node. This can be caused by a fault on the transmit side of the second network node or receive side of the third network node. A corresponding message can be generated and transported via the network, for example by means of the simple network management protocol (SNMP). FIG. 9 shows a parameter value of different network nodes 3 in the time domain. It is also possible to perform a frequency transformation to the frequency domain and to show frequency spectrums of control signals or control parameters CP in the frequency domain. Further, it is possible to calculate and indicate correlations between different parameter values of different network nodes 3. In a spectrum analysis it is possible to monitor a spectrum of clock control signals and to provide an even greater level of information to the operator or user. The monitoring program performing the method according to the present invention can be performed in a central node or a network element such as the network management system 6 as shown in FIG. 7. It is also possible in a specific embodiment that each network node 1 in the synchronous network 1 is able to execute such a monitoring program. If an instability in a network node 3 occurs a switch-over from the faulty network node 3 to another network node to change the path of clock signal distribution can be performed. This switch-over can be performed depending on the analysed data. In a possible embodiment the network management system 6 can read out the control parameter tables (CPTs) of the network nodes 3 in regular time intervals. In an alternative embodiment the control parameter tables CPTs are read out upon request or in response to an alarm message received from a network node 3. The network management system 6 as shown in FIG. 7 can also be integrated in one of the network nodes 3-*i*. The network nodes 3-*i* can be connected to each other via wired or wireless links comprising optical or electrical connections.

The control parameters CPs are measured with enough resolution to provide confidence that the related frequency is not varying outside of allowed limits for the application in hand. To achieve frequency stability for a mobile base station it is ensured the networks deliver control parameters CPs with a variation of less than +/−50 ppb.

Figure 10:
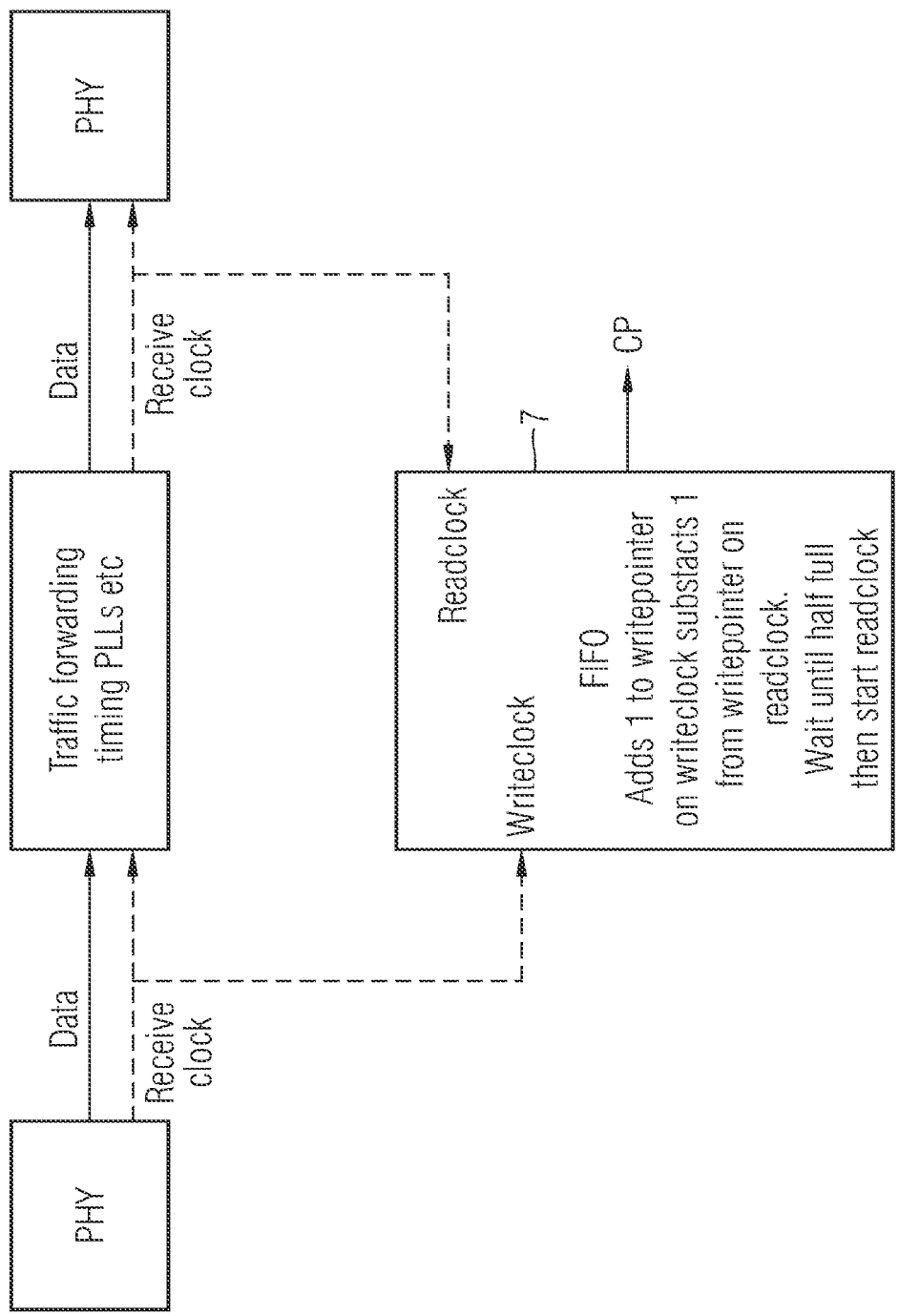
FIG. 10 shows a block diagram of a possible embodiment of a network node according to the present invention.

In a further possible embodiment as shown in FIG. 10 an instability of a reference clock distributed within the synchronous network 1 can be detected by using for example a FIFO register within a network node 3. In this embodiment dummy data can be written into this FIFO register with the frequency of the incoming reference clock. Further, dummy data is read out of the FIFO register at a rate of the outgoing transmit clock. The FIFO register 7 can for example provide different kinds of flags such as an EMPTY flag, a HALF FULL flag or a FULL flag. The dummy data is written into the FIFO register at the incoming clock rate until the HALF FULL flag HF indicates that the FiFO register 7 has now been filled up to 50% of its storage capacity. When the HALF FULL flag HF has been activated one starts to read out dummy data from the FIFO register 7. If the incoming reference clock and the outgoing reference clock are locked to each other the HF flag will vary periodically with a sequence such as 10101010101 or a sequence such as 11001100101001100110100110 i.e. an average markspace ratio of 50%. If the incoming and outgoing clocks are unlocked, the clock variation is likely to cause the sampled HF flag to deviate in the run length of 1 s or 0 s, and a change in the mark-space ratio. In a further possible embodiment a writepointer is monitored instead of the half full flag. In the embodiment of FIG. 10 internal control parameters CP of the timing circuit 3A are formed by a flag such as the HF flag or a writepointer of a FIFO register 7 forming a timing circuit 3A within the network node 3-*i* according to the present invention. This embodiment has the advantage that the timing circuit 3A as well as the clock stability monitoring circuit 3B can be implemented with low technical complexity. In this embodiment the timing circuit 3A comprises a FIFO register 7 having at least one flag monitored by a clock stability monitoring circuit 3B.

The invention claimed is:

1. A network node of a synchronous network, comprising:
 a timing circuit, which recovers a reference clock from a reception signal received by said network node from an upstream network node of said synchronous network and uses the recovered reference clock for a transmission signal transmitted by said network node to a downstream network node of said synchronous network; and
 a clock stability monitoring circuit which monitors internal control parameters of said timing circuit to detect an instability of the reference clock distributed within said synchronous network,
 wherein the timing circuit comprises a register in which dummy data is written with a reception clock rate and from which said dummy data is read with a transmission clock rate to detect said instability of the distributed reference clock.

2. The network node according to claim 1,
 wherein said timing circuit comprises a phase locked loop circuit for recovery of said reference clock from said reception signal.

3. The network node according to claim 2,
 wherein said phase locked loop circuit is an analogue PLL circuit or a digital PLL circuit.

4. The network node according to claim 1,
 wherein said clock stability monitoring circuit, monitors the internal control parameters of said timing circuit, in the time domain and/or in the frequency domain.

5. The network node according to claim 1,
 wherein the monitored control parameters are written into a control parameter table stored in a local memory of said network node.

6. The network node according to claim 1,
 wherein the clock stability monitoring circuit generates an alarm message if a monitored control parameter is not within a predetermined normal operation range.

7. The network node according claim 1,
 wherein the distributed reference clock is generated by a primary reference clock generator of said synchronous network.

8. The network node according to claim 1,
 wherein said control parameter table stored in the local memory of said network node is read out by a network management system of said synchronous network.

9. The network node according to claim 8,
 wherein the network management system analyses the read out control parameters of the network node to identify a faulty entity within the network node causing a reference clock instability in said synchronous network.

10. The network node according to claim 1 further comprising an injection circuit provided to adapt at least one control parameter of the timing circuit of said network node to cause an observable change of the reference clock forwarded to a downstream network node of said synchronous network.

11. The network node according to claim 1,
 wherein said network node is a synchronous Ethernet device or a 1588 Precision Time Protocol device.

12. A synchronous network comprising:
 network nodes according to claim 1,
 a primary reference clock generator for generating a primary reference clock distributed in said synchronous network, and
 a network management system for analyzing the control parameters of the network nodes of said synchronous network in the time or frequency domain.

13. The synchronous network according to claim 12,
 wherein at least one network node is connected to a base station of a mobile telephone network which receives the distributed reference clock from the synchronous network.

14. A method for detecting instability of a reference clock distributed within a synchronous network, comprising:
 monitoring internal control parameters of a timing circuit adapted to recover the distributed reference clock within a network node of said synchronous network to detect the instability of the distributed reference clock,
 wherein the timing circuit comprises a register in which dummy data is written with a reception clock rate and from which said dummy data is read with a transmission clock rate to detect said instability of the distributed reference clock.

* * * * *